US006095825A

United States Patent [19]

Liao

[11] Patent Number: 6,095,825

[45] Date of Patent: Aug. 1, 2000

[54] POWER ADAPTER FOR INTERCONNECTING DIFFERENT TYPES OF POWER CONNECTORS

[75] Inventor: Ivan Liao, Pa-Te, Taiwan

[73] Assignee: Hon Hai Precision Ind. Co., Ltd., Taipei Hsien, Taiwan

[21] Appl. No.: 09/130,389

[22] Filed: Aug. 6, 1998

[30] Foreign Application Priority Data

Aug. 9, 1997 [TW] Taiwan ................................ 86213751

[51] Int. Cl.[7] .............................. H01R 12/00; H05K 1/00

[52] U.S. Cl. ............................................................ 439/76.1

[58] Field of Search .................................... 439/638, 76.1, 439/654, 502

[56] References Cited

U.S. PATENT DOCUMENTS

| | | | |
|---|---|---|---|
| 4,894,630 | 1/1990 | Ueta | 333/185 |
| 5,217,394 | 6/1993 | Ho | 439/638 |
| 5,257,948 | 11/1993 | Peterson | 439/571 |
| 5,406,450 | 4/1995 | Shieh | 439/638 |
| 5,507,668 | 4/1996 | Lambrinos | 439/638 |

*Primary Examiner*—Lincoln Donovan
*Assistant Examiner*—Javaid Nasri

[57] ABSTRACT

A power adapter for electrically interconnecting different types of a first and second power connectors, includes a first connector portion, a second connector portion, an insulated cover mechanism, a substrate and a mini header with a bunch of electric wires. The first connector portion receives a number of first terminals therein for coupling with the first power connector. The second connector portion receives a number of second terminals therein and is different from the first connector portion in both dimension and electrical configuration for coupling with the second power connector. The substrate on which the first and second connector portions are mounted, is printed with a plurality of conductive traces for transferring electrical signals therebetween. A number of electric wires are exposed to an outside of the cover mechanism to be attached to the mini header for electrical connection with a mother board on which the power adapter is mounted.

6 Claims, 4 Drawing Sheets

POWER ADAPTER FOR INTERCONNECTING DIFFERENT TYPES OF POWER CONNECTORS

BACKGROUND OF THE INVENTION

1. Field of the Invention

The present invention relates to a power adapter, and more particularly to a power adapter which interconnects different types of power connectors so as to transfer an output power transmitted therebetween.

2. The Prior Art

The design of a mother printed circuit board is repeatedly upgraded for complying with an issuance of each new electrical member to be mounted thereon. Some peripheral electrical devices such as a power supply and the related power connector must also be adapted to accommodate the new type of printed circuit board. Therefore, various power connectors are continually proposed to satisfy different consumers' demands such as those disclosed in U.S. Pat. Nos. 4,975,075, 4,979,912, 5,131,867, 5,257,948 and 5,342, 221.

To save costs, both consumers and manufacturers expect to replace only the original printed circuit board in a computer system. Some original electrical devices like the power supply and the associated power connector must support the new type of installed printed circuit board and its associated mating connector. However, this is usually not achieved due to the incompatibility between the mated power connectors.

To resolve the aforementioned disadvantage, an object of the present invention is to provide a power adapter which interconnects different types of power connectors respectively disposed on a power supply and a mother board so as to transfer signals therebetween. Meanwhile, the power supply and the mother board respectively belong to different types of computer systems.

SUMMARY OF THE INVENTION

According to an aspect of the present invention, a power adapter for electrically interconnecting different types of a first and second power connectors, includes a first connector portion, a second connector portion, an insulated cover means, a substrate and a mini header including several electric wires. The first connector portion comprises a first connector receiving a number of first terminals therein for coupling with the first power connector mounted on a mother board. The second connector portion comprises two side by side second connectors each receiving a number of second terminals therein. The second connector portion is different from the first connector portion in both dimension and electrical configuration for coupling with the second power connector equipped on a power supply. The insulated cover means consists of top and bottom covers wherein the top cover further forms opposing gates in communication with each other at front and rear ends thereof. The substrate on which the first and second connector portions are mounted is printed with a plurality of conductive traces for transferring signals therebetween. The electric wires are partially exposed to an outside of the cover means to be attached to the mini header for electrical connection with the mother board.

DETAILED DESCRIPTION OF THE PREFERRED EMBODIMENT

Figure 1:
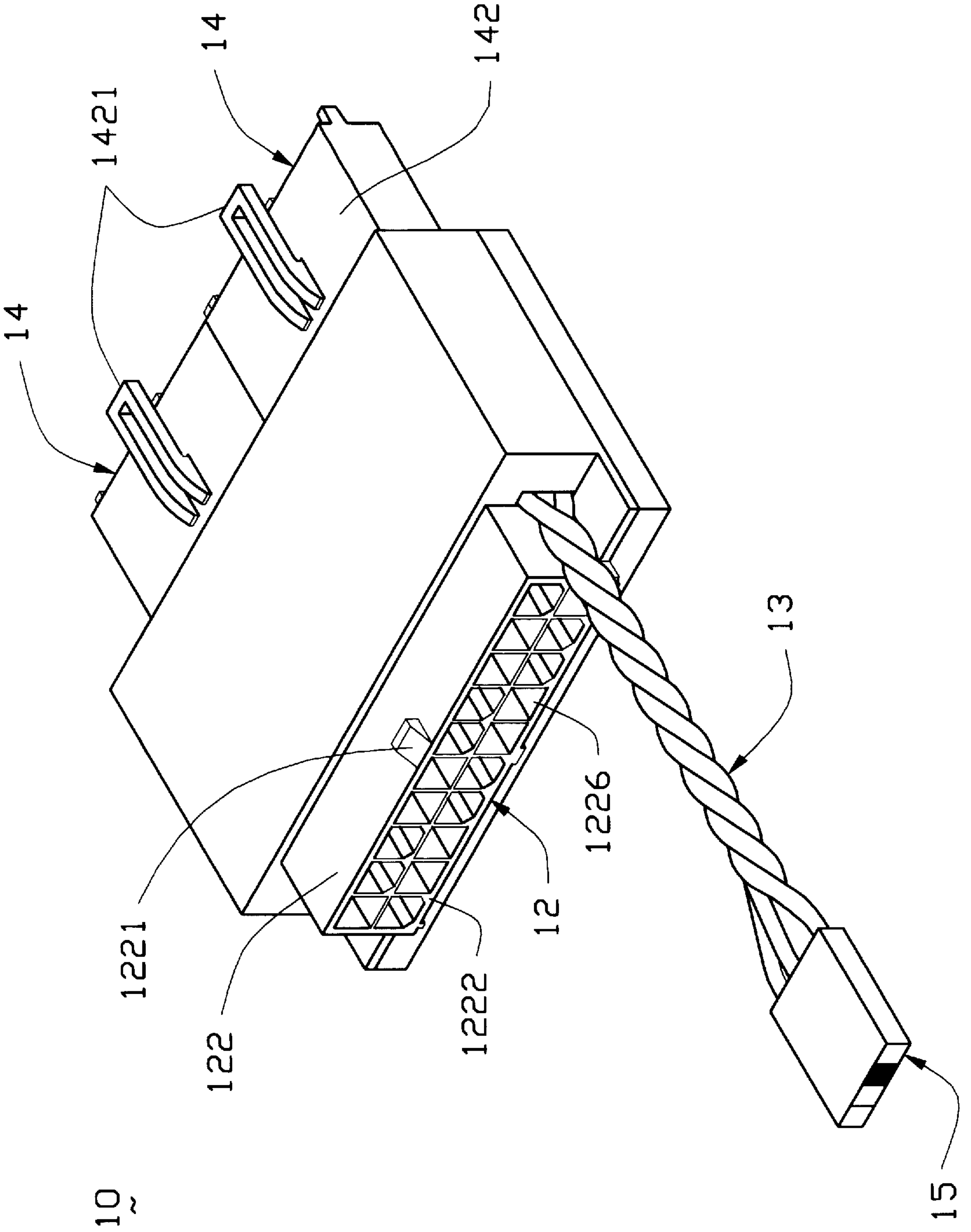
FIG. 1 is a perspective view of a power adapter in accordance with the present invention.
Figure 2:
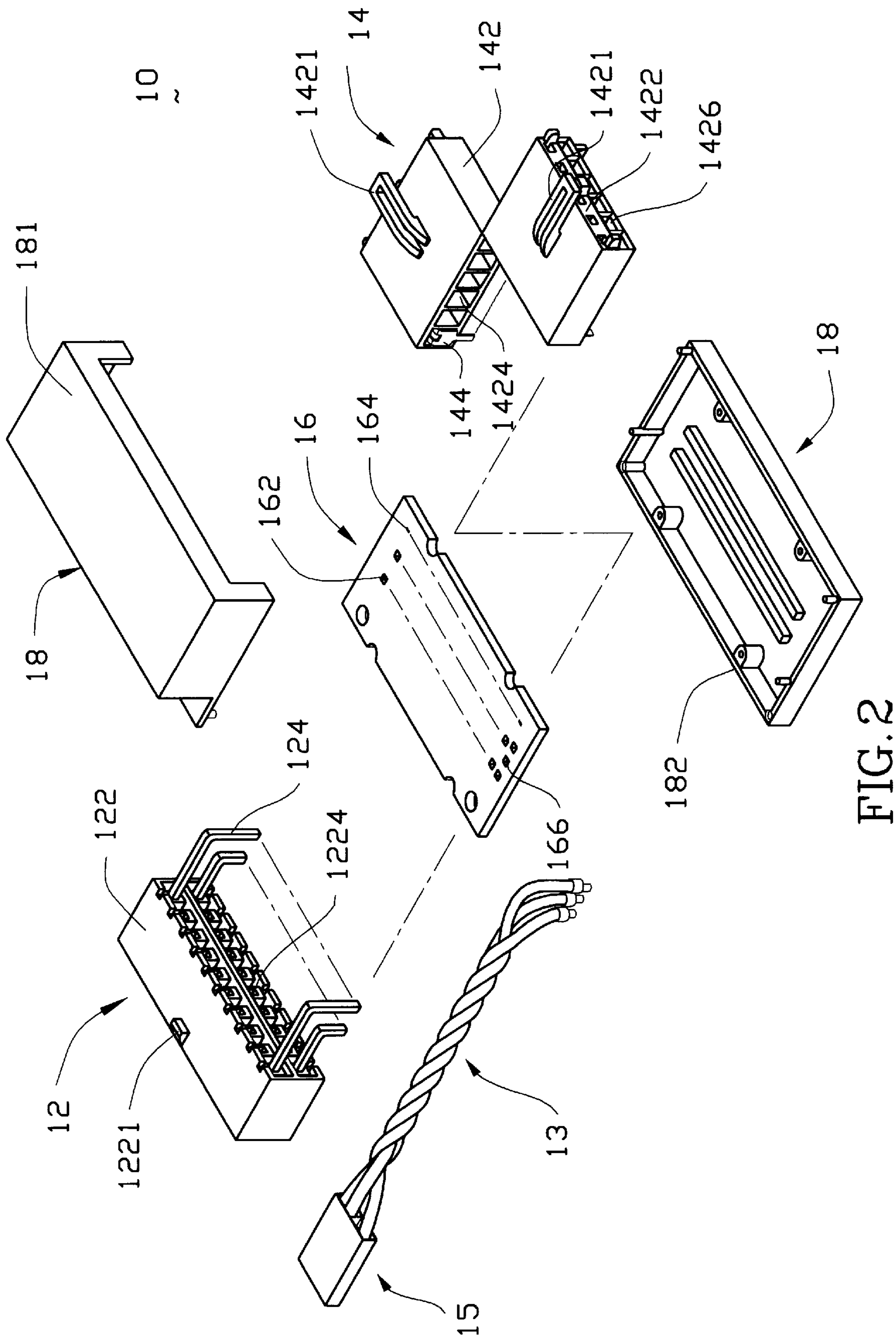
FIG. 2 is an exploded perspective view of FIG. 1.

Reference will now be in detail to the preferred embodiment of the present invention. Attention is directed to FIGS. 1 and 2, a power adapter 10 for electrically interconnecting a first power connector (not shown) of a mother board (not shown) to which the power adapter 10 is connected and a second power connector (not shown) of a power (not shown), includes a first connector portion 12, a second connector portion 14, a mini header 15, an insulated cover means 18 and a substrate 16.

The first connector portion 12 comprises a first connector for appropriately coupling with the first power connector of the mother board. The first connector includes a first insulated housing 122 and a plurality of first passageways 1224 defined through a first mating surface 1222 of the first housing 122 each forming a first opening 1226 for reception of a first terminal 124. A first protrusion 1221 is integrally formed above the first mating surface 1222 for latchingly enhancing electrical engagement between the first power connector and the first connector.

The second connector portion 14 comprises two second connectors for appropriately coupling with the second power connector of the power supply. Each second connector is different from said first connector in both dimension and electrical configuration, and includes a second insulated housing 142 and a plurality of second passageways 1424 defined through a second mating surface 1422 of the second housing 142 and forming a second opening 1426 for reception of a second terminal 144 therein. A second protrusion 1421 is integrally formed above each second mating surface 1422 for latchingly enhancing electrical engagement between the mated second power connector and the second connector.

Figure 3:
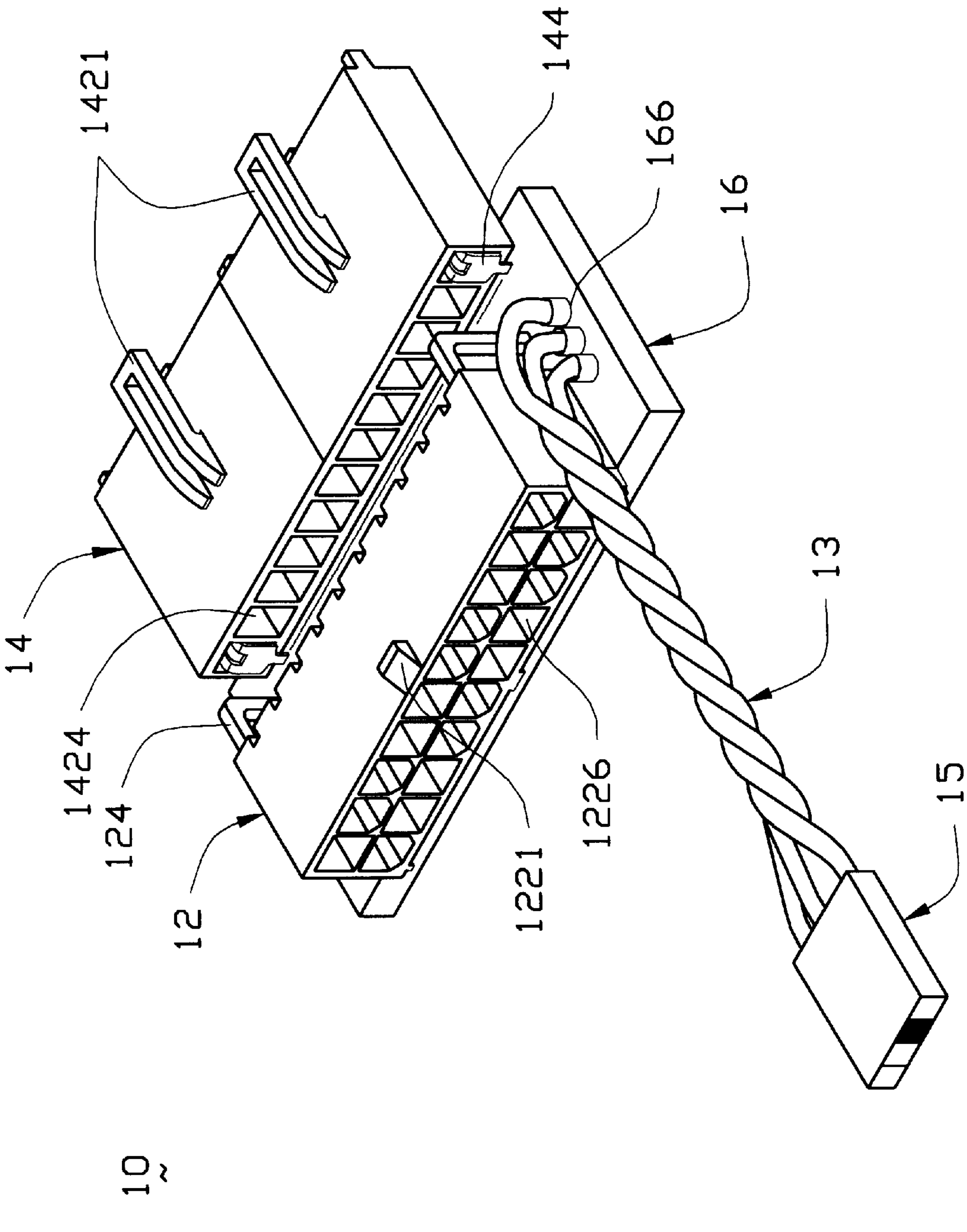
FIG. 3 is a perspective front view of the power adapter with the cover removed therefrom.
Figure 4:
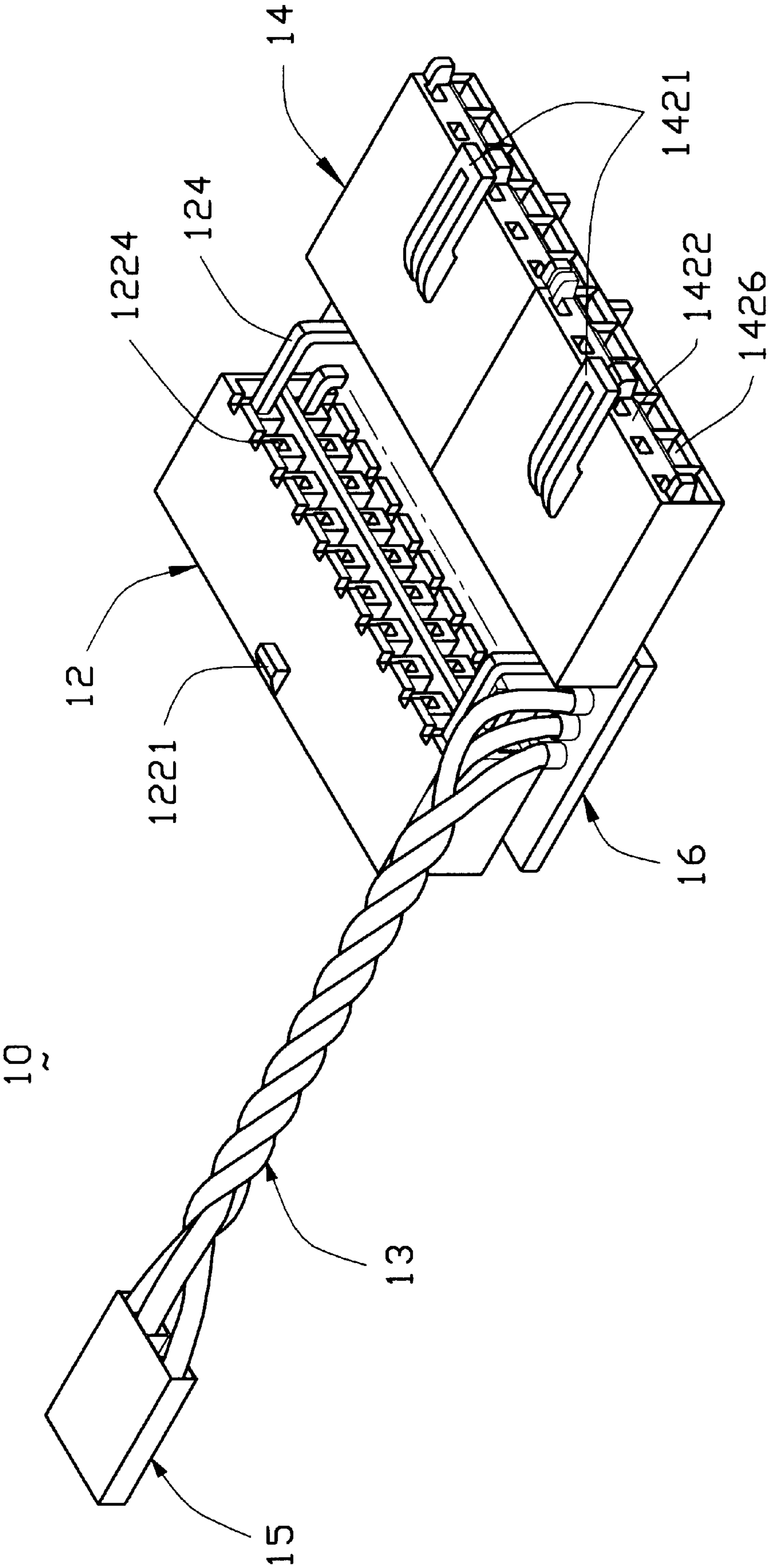
FIG. 4 is a perspective back view of power adapter with the cover removed therefrom.

Further referring to FIGS. 2, 3 and 4, the substrate 16 defines a plurality of first and second bores 162, 164. A number of conductive traces printed on a top surface of the substrate 16 specifically facilitate electrical connection between the first and second bores 162, 164 in transformation.

The insulated cover means 18 consists of a top cover 181 and a bottom cover 182 wherein the top cover 181 further defines opposing gates (not labeled) in communication with each other at front and rear ends thereof. The mini header 15 for electrically connecting to the mother board, is jointed with several electric wires 13 at a rear end thereof.

In assembly, the first and second connector portions 12, 14 are mounted on the substrate 16, wherein the first and second mating surfaces 1222, 1422 face outward in opposite directions. Meanwhile, the two second connectors of the second connector portion 14 are arranged side by side. The first and second terminals 124, 144 each includes a tail which is respectively inserted into the corresponding first and second bore 162, 164. The electric wires 13 have free ends fixedly attached to third bores 166 defined in the substrate 16. Ultimately, as shown in FIG. 1, the top and bottom covers 181, 182 sandwich and enclose the substrate 16 and the electrical engagements of each connector portion 12, 14 with the substrate 16 therebetween except that the first and second mating surfaces 1222, 1422 of the first and second connector portions 12, 14 are exposed to an outside of the cover means 18 through the gates. The electric wires 13 jointed with the mini header 15 extend outward from the substrate 16 through the front gate of the top cover 181.

Therefore, the power adapter 10 of the present invention is capable of interconnecting the first power connector equipped on the mother board and the second power connector equipped on the power supply, transferring electrical signals therebetween. Meanwhile, the power supply and the mother board respectively belong to different types of computer systems.

While the present invention has been described with reference to specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. A power adapter for electrically interconnecting different types of a first power connector mounted on a mother board and a second power connector provided on a power supply, comprising:

a first connector portion comprising a first connector defining a plurality of first passageways for reception of a number of first terminals therein, and adapted for coupling with a first power connector of a mother board;

a second connector portion comprising two side by side second connectors each defining a plurality of second passageways for reception of a number of second terminals therein, the second connector portion being different from said first connector portion in both dimension and electrical configuration and being adapted for coupling with a second power connector of a power supply;

a substrate defining a plurality of first bores each receiving a tail of the first terminal therein and a plurality of second bores each receiving a tail of the second terminal therein, and printed with a plurality of conductive traces on a top surface thereof for electrical connection between the first and second bores;

a plurality of electric wires connected to the substrate;

a mini header connected to the electric wires for interconnecting the substrate with the mother board; and insulated cover means enclosing the electrical engagement of each connector portion with the substrate;

wherein the electric wires extend outwardly from the cover means to be connected with the mini header.

2. The adapter as described in claim 1, wherein the first connector includes an insulated first housing and a first protrusion formed on the first housing for engaging with a first power connector.

3. The adapter as described in claim 1, wherein each second connector includes an insulated second housing and a second protrusion formed on the second housing for engaging with a second power connector.

4. The adapter as described in claim 1, wherein the cover means consists of top and bottom covers, the top cover defining opposite gates in communication with each other for partially exposing the first and second connector portions to an outside of the cover means.

5. The adapter as described in claim 1, wherein the substrate further defines a plurality of third bores therein each receiving a free end of the corresponding electric wire.

6. A power adapter for electrically interconnecting different types of a first power connector mounted on a mother board and a second power connector provided on a power supply, comprising:

a first connector portion having a number of first terminals for coupling with a first power connector of a mother board;

a second connector portion having a number of second terminals for coupling with a second power connector of a power supply;

a substrate, on which the first connector portion and the second connector portion are back to back positioned, having a plurality of conductive traces printed thereon for electrically connecting the first connector portion and the second connector portion;

a plurality of electric wires connected to the substrate and positioned adjacent the first connector portion;

a third connector portion electrically connected to the wires for interconnection between the power adapter and the mother board; and cover means enclosing partly the first and second connector portions with the substrate while exposing the full third connector portion to an exterior;

wherein the first connector portion, the third connector portion and the electric wires extend out of one side of the cover means for common exposure toward the mother board.

* * * * *